(12) United States Patent
Hirayama

(10) Patent No.: US 11,854,772 B2
(45) Date of Patent: Dec. 26, 2023

(54) PLASMA PROCESSING APPARATUS AND PLASMA PROCESSING METHOD

(71) Applicants: TOKYO ELECTRON LIMITED, Tokyo (JP); TOHOKU UNIVERSITY, Miyagi (JP)

(72) Inventor: Masaki Hirayama, Tokyo (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 376 days.

(21) Appl. No.: 17/311,149

(22) PCT Filed: Nov. 26, 2019

(86) PCT No.: PCT/JP2019/046236
§ 371 (c)(1),
(2) Date: Jun. 4, 2021

(87) PCT Pub. No.: WO2020/116257
PCT Pub. Date: Jun. 11, 2020

(65) Prior Publication Data
US 2022/0028666 A1    Jan. 27, 2022

(30) Foreign Application Priority Data
Dec. 6, 2018 (JP) ................................. 2018-229243

(51) Int. Cl.
*H01J 37/32* (2006.01)
(52) U.S. Cl.
CPC .. *H01J 37/32715* (2013.01); *H01J 37/32082* (2013.01); *H01J 37/32449* (2013.01); *H01J 37/32513* (2013.01); *H01J 37/32568* (2013.01); *H01J 2237/20235* (2013.01)

(58) Field of Classification Search
None
See application file for complete search history.

(56) References Cited

U.S. PATENT DOCUMENTS

| 8,382,941 B2* | 2/2013 | Harrington | ....... H01L 21/67069 |
| | | | 156/345.43 |
| 9,655,224 B2* | 5/2017 | Jung | ..................... H05H 1/2406 |
| 9,980,362 B1* | 5/2018 | Knausdorf | ........... H05H 1/2406 |

FOREIGN PATENT DOCUMENTS

JP      2003-243376 A     8/2003

* cited by examiner

*Primary Examiner* — Roberts P Culbert
(74) *Attorney, Agent, or Firm* — Nath, Goldberg & Meyer; Jerald L. Meyer; Tanya E. Harkins

(57) ABSTRACT

A plasma processing apparatus according to an exemplary embodiment includes a processing container, a stage, a dielectric plate, an upper electrode, an introduction part, a driving shaft, and an actuator. The stage is provided in the processing container. The dielectric plate is provided above the stage via a space in the processing container. The upper electrode has flexibility, is provided above the dielectric plate, and provides a gap between the dielectric plate and the upper electrode. The introduction part is an introduction part of radio frequency waves that are VHF waves or UHF waves, is provided at a horizontal end portion of the space. The driving shaft is coupled to the upper electrode on a central axial line of the processing container. The actuator is configured to move the driving shaft in a vertical direction.

18 Claims, 9 Drawing Sheets

PLASMA PROCESSING APPARATUS AND PLASMA PROCESSING METHOD

This is a National Phase Application filed under 35 U.S.C. 371 as a national stage of PCT/JP2019/046236, filed Jun. 6, 2021, an application claiming the benefit of Japanese Application No. 2018-229243, filed Dec. 6, 2018, the content of each of which is hereby incorporated by reference in its entirety.

TECHNICAL FIELD

The exemplary embodiments of the present disclosure relate to a plasma processing apparatus and a plasma processing method.

BACKGROUND

A plasma processing apparatus is being used in manufacturing electronic devices. A type of plasma processing apparatus is disclosed in Patent Document 1. The plasma processing apparatus disclosed in Patent Document 1 includes a vacuum container, a process chamber, a support electrode, an antenna, and a radiation port. The process chamber is provided inside the vacuum container. A gas is supplied into the process chamber. The support electrode is provided in the process chamber. The support electrode supports a substrate. The antenna and the radiation port supply radio frequency waves of the very high frequency (VHF) band or the ultra-high frequency (UHF) band into the process chamber. The plasma processing apparatus disclosed in Patent Document 1 includes an electric field control space. The electric field control space is composed of a dielectric and a metal partition plate or disk-shaped metal surrounding the dielectric. The VHF band is a frequency band in a range of about 30 MHz to 300 MHz. The UHF band is a frequency band in a range of about 300 MHz to 3 GHz.

PRIOR ART DOCUMENT

[Patent Document]
Patent Document 1: Japanese Laid-open Publication No. 2003-243376

SUMMARY

A plasma processing apparatus is required to adjust a distribution of plasma density in a radial direction with respect to a central axial line in a processing container.

According to one exemplary embodiment, a plasma processing apparatus is provided. The plasma processing apparatus includes a processing container, a stage, a dielectric plate, an upper electrode, an introduction part, a driving shaft, and an actuator. The stage is provided in the processing container. The dielectric plate is provided above the stage via a space in the processing container. The upper electrode has flexibility. The upper electrode is provided above the dielectric plate and is configured to provide a gap between the dielectric plate and the upper electrode. The introduction part is a radio frequency introduction part and is provided at a horizontal end portion of the space. The radio frequency waves are VHF waves or UHF waves. The driving shaft is coupled to the upper electrode on a central axial line of the processing container. The central axial line extends in a vertical direction and includes the center of the stage. The actuator is configured to move the driving shaft in the vertical direction.

According to the plasma processing apparatus of one exemplary embodiment, it is possible to adjust a distribution of plasma density in a radial direction with respect to a central axial line in a processing container.

DETAILED DESCRIPTION

Figure 1:
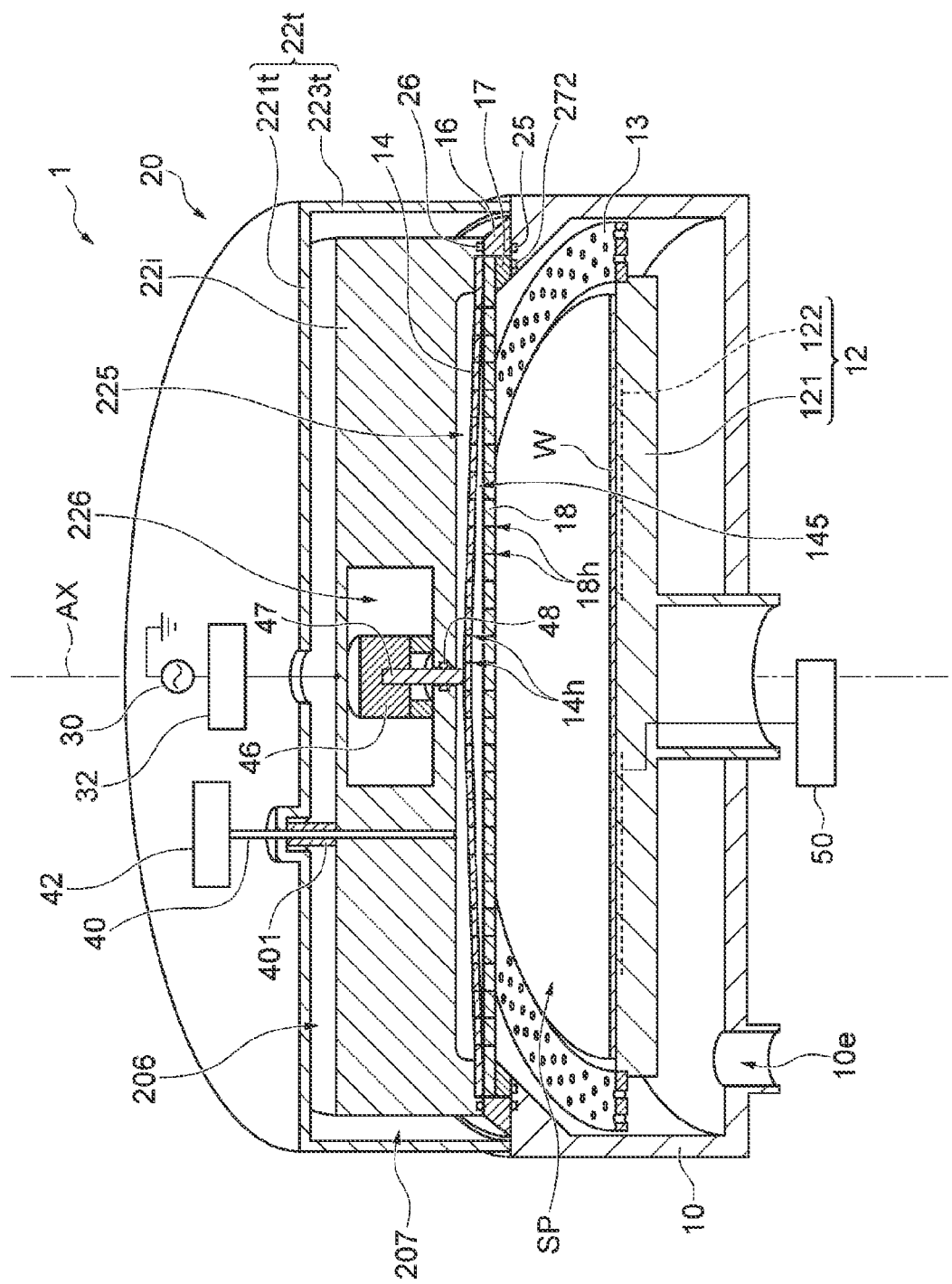
FIG. 1 is a view schematically illustrating a plasma processing apparatus according to one exemplary embodiment.

Hereinafter, various exemplary embodiments will be described.

In one exemplary embodiment, a plasma processing apparatus is provided. The plasma processing apparatus includes a processing container, a stage, a dielectric plate, an upper electrode, an introduction part, a driving shaft, and an actuator. The stage is provided in the processing container. The dielectric plate is provided above the stage via a space in the processing container. The upper electrode has flexibility. The upper electrode is provided above the dielectric plate and is configured to provide a gap between the dielectric plate and the upper electrode. The introduction part is an introduction part of radio frequency waves and is provided at a horizontal end portion of the space. The radio frequency waves are VHF waves or UHF waves. The driving shaft is coupled to the upper electrode on a central axial line of the processing container. The central axial line extends in a vertical direction and includes a center of the stage. The actuator is configured to move the driving shaft in the vertical direction.

In the plasma processing apparatus according to the above exemplary embodiment, when the driving shaft is moved in the vertical direction by the actuator, the center of the upper electrode moves in the vertical direction. As a result, a length of the gap in the vertical direction is adjusted according to a distance from the central axial line. Accordingly, intensity of an electric field formed by the radio frequency waves is adjusted according to a distance in the radial direction from the central axial line. Therefore, distribution of plasma density in the radial direction with respect to the central axial line can be adjusted.

In one exemplary embodiment, the plasma processing apparatus may further include an elastic member. In this embodiment, the elastic member is interposed between a peripheral edge portion of the dielectric plate and the processing container. In this embodiment, the peripheral edge portion of the dielectric plate can be elastically supported between the processing container and the upper electrode via the elastic member. According to this embodiment, damage to the dielectric plate is suppressed.

In one exemplary embodiment, a plurality of slits may be formed in the upper electrode. In this embodiment, the plurality of slits extends to a periphery of the upper electrode along the radial direction with respect to the central axial line. According to this embodiment, the upper electrode is more likely to be bent.

In one exemplary embodiment, a length of the gap in the vertical direction on the central axial line may be longer than a length of the gap in the vertical direction at a location distanced from the central axial line. According to this embodiment, when radio frequency waves intensify each other on the central axial line, non-uniformity in intensity of the electric field, which is formed by the radio frequency waves, in the radial direction can be reduced.

In one exemplary embodiment, the length of the gap in the vertical direction on the central axial line may be shorter than the length of the gap in the vertical direction at a location distanced from the central axial line. According to this embodiment, attenuation of radio frequency waves accompanying propagation from the introduction part toward the central axial line can be suppressed.

In one exemplary embodiment, the length of the gap in the vertical direction may vary depending on a location in the radial direction with respect to the central axial line. According to this embodiment, harmonic waves can be suppressed. In one exemplary embodiment, a lower surface of the upper electrode may be wavy in any cross section including the central axial line.

In one exemplary embodiment, a plurality of gas discharge holes configured to discharge a gas, which is supplied into the gap, into the space may be formed in the dielectric plate. That is, the dielectric plate may be a shower plate configured to discharge a gas.

In one exemplary embodiment, the plasma processing apparatus may further include a lid. In this embodiment, the lid is provided above the upper electrode. The lid provides a gas diffusion space between the upper electrode and the lid. The diffusion space is in communication with the gap via the upper electrode. The driving shaft is connected to the actuator through at least a portion of the lid. In this embodiment, the plasma processing apparatus may further include a seal provided between the lid and the driving shaft. In one exemplary embodiment, the seal may be an O-ring. In another exemplary embodiment, the seal may be a bellows provided between the lid and the driving shaft.

In one exemplary embodiment, a plurality of through-holes bringing the diffusion space and the gap into communication with each other may be formed in the upper electrode. The plurality of through-holes may be disposed so that a lower end opening of each of the plurality of through-holes faces an upper end opening of a corresponding one of the plurality of gas discharge holes. According to this embodiment, a gas easily flows from each of the plurality of through-holes to the corresponding gas discharge hole.

In another exemplary embodiment, a plasma processing method is provided in which a plasma processing apparatus is used to perform a plasma processing on a substrate. The plasma processing method includes supplying a gas into a space in a processing container of the plasma processing apparatus. The plasma processing method further includes introducing radio frequency waves into the space in order to perform the plasma processing on a substrate placed on a stage in the processing container. The plasma processing apparatus is one of the plasma processing apparatuses according to the various exemplary embodiments described above.

In the plasma processing method according to the above exemplary embodiment, the substrate is processed with plasma having a density distribution adjusted in a radial direction with respect to a central axial line.

Hereinafter, various exemplary embodiments will be described in detail with reference to the drawings. Throughout the drawings, the same or equivalent parts are denoted by the same reference numerals.

FIG. 1 is a view schematically illustrating a plasma processing apparatus according to one exemplary embodiment. A plasma processing apparatus 1 illustrated in FIG. 1 includes a processing container 10, a stage 12, an upper electrode 14, and an introduction part 16.

The processing container 10 has a substantially cylindrical shape. The processing container 10 extends along a vertical direction. A central axial line of the processing container 10 is an axial line AX extending in the vertical direction. The processing container 10 is formed of a conductor such as aluminum or an aluminum alloy. A corrosion-resistant film is formed on a surface of the processing container 10. The corrosion-resistant film may be an yttrium oxide film, an yttrium oxyfluoride film, an yttrium fluoride film, or a ceramic film containing yttrium oxide or yttrium fluoride. The processing container 10 is grounded.

The stage 12 is provided inside the processing container 10. The stage 12 is configured to substantially horizontally support a substrate W placed on an upper surface thereof. The stage 12 has a substantially disk shape. A central axial line of the stage 12 substantially coincides with the axial line AX. That is, a center of the stage 12 is located on the axial line AX.

Figure 2:
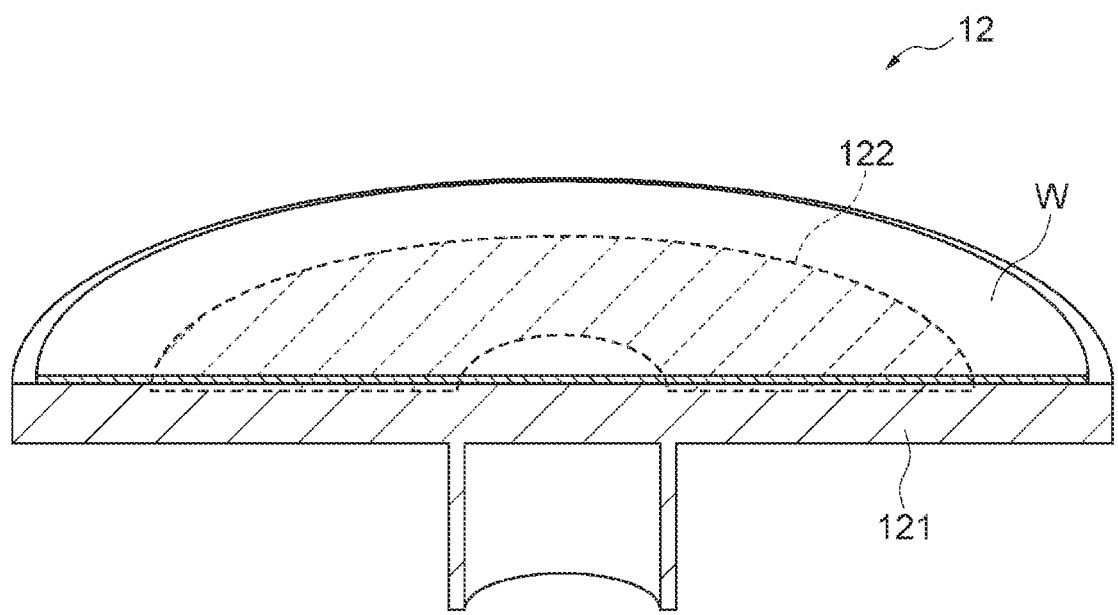
FIG. 2 is a broken perspective view illustrating a stage of one example.

Hereinafter, FIG. 2 is referenced together with FIG. 1. FIG. 2 is a broken perspective view illustrating a stage of one example. In one example, the stage 12 has a main body 121 and a conductive layer 122. The main body 121 is formed of an insulator such as aluminum nitride. The main body 121 has a substantially disk shape. A central axial line of the main body 121 may substantially coincide with the axial line AX. That is, the axial line AX may include the center of the stage 12.

The conductive layer 122 is formed of a conductive material such as tungsten or molybdenum. The conductive layer 122 is provided inside the main body 121. The stage 12 may have one or more conductive layers. In this case, the conductive layer 122 has the shortest distance from the upper surface of the stage 12 among the one or more conductive layers provided inside the stage 12.

The conductive layer 122 is formed in an annular shape around the axial line AX. An inner diameter of the conductive layer 122 is, for example, ⅙ of a diameter of the substrate W, that is, 50 mm or more. An outer diameter of the conductive layer 122 is smaller than the diameter of the substrate W. In one embodiment, the conductive layer 122 may be formed in a mesh shape.

In one embodiment, the conductive layer 122 is an electrode for electrostatic adsorption. In this embodiment, a DC power supply 50 is electrically connected to the conductive layer 122. When a DC voltage from the DC power supply 50 is applied to the conductive layer 122, electrostatic attractive force is generated between the stage 12 and the substrate W. The substrate W is attracted to the stage 12 by the generated electrostatic attractive force and is held by the stage 12. In another embodiment, the conductive layer 122 may be a radio frequency electrode. In this case, a radio frequency power supply is electrically connected to the conductive layer 122 via a matching device. In still another embodiment, the conductive layer 122 may be a grounded electrode.

As described above, the conductive layer 122 of the stage 12 is formed in an annular shape. Therefore, generation of a potential difference due to radio frequency waves between a central portion and an outer peripheral portion of the stage 12 is suppressed. As a result, a radio frequency electric field generated between the central portion and the outer peripheral portion of the stage 12 is suppressed.

In one embodiment, the plasma processing apparatus 1 may further include a baffle member 13. The baffle member 13 extends between the stage 12 and a sidewall of the processing container 10. The baffle member 13 is a substantially annular plate member. The baffle member 13 is formed of an insulator such as aluminum oxide. A plurality of through-holes is formed in the baffle member 13. The plurality of through-holes penetrates the baffle member 13 in a plate thickness direction. An exhaust port 10e is formed in the processing container 10 below the stage 12. An exhaust device is connected to the exhaust port 10e. The exhaust device includes a pressure control valve and a vacuum pump such as a turbo molecular pump and/or a dry pump.

The plasma processing apparatus 1 further includes a dielectric plate 18. The dielectric plate 18 is provided above the stage 12 via a space SP in the processing container 10. The dielectric plate 18 is a plate formed of a dielectric. The dielectric plate 18 may have a substantially circular planar shape. The dielectric plate 18 is formed of aluminum nitride, aluminum oxide, yttrium oxide, or a dielectric containing aluminum nitride, aluminum oxide, or yttrium oxide. A corrosion-resistant film may be formed on at least a lower surface of surfaces of the dielectric plate 18. The corrosion-resistant film may be an yttrium oxide film, an yttrium oxynitride film, an yttrium fluoride film, or a ceramic film containing yttrium oxide or yttrium fluoride. A distance in the vertical direction between the lower surface of the dielectric plate 18 and the upper surface of the stage 12 is, for example, 5 cm or more and 30 cm or less.

The upper electrode 14 is provided above the dielectric plate 18. The upper electrode 14 and the dielectric plate 18 are configured to provide a gap 145 therebetween. The upper electrode 14 is formed of a conductor such as aluminum or an aluminum alloy. The upper electrode 14 has flexibility. The upper electrode 14 may be formed of a plate member formed of a conductor. The upper electrode 14 may have a substantially circular planar shape. In one embodiment, a central axial line of the upper electrode 14 substantially coincides with the axial line AX.

In one embodiment, the dielectric plate 18 is formed with a plurality of gas discharge holes 18h so as to evenly supply a gas to the entire surface of the substrate W placed on the stage 12. That is, the dielectric plate 18 may be a shower plate configured to discharge a gas.

In the plasma processing apparatus 1, an area of an inner wall surface of the processing container 10 extending above the baffle member 13 is substantially equal to a surface area of the dielectric plate 18 on a side of the space SP. That is, an area of a plane set to the ground potential (a ground plane) among planes defining the space SP is substantially equal to an area of a plane provided by the dielectric plate 18 among the planes defining the space SP. With this configuration, plasma is generated at a uniform density in a region directly below the dielectric plate 18 and a region around the ground plane. This results in improvement of in-plane uniformity of plasma processing for the substrate W.

In one embodiment, a peripheral edge portion of the dielectric plate 18 is provided between a peripheral edge portion of the upper electrode 14 and an upper end of the processing container 10. In one embodiment, the peripheral edge portion of the dielectric plate 18 is elastically held between the peripheral edge portion of the upper electrode 14 and the upper end of the processing container 10. In one embodiment, the peripheral edge portion of the dielectric plate 18 is sandwiched between the peripheral edge portion of the upper electrode 14 and the upper end of the processing container 10 via an elastic member 272. The elastic member 272 is, for example, an O-ring. A support ring 17 may be further provided between the peripheral edge portion of the dielectric plate 18 and the upper end of the processing container 10. The support ring 17 is formed of a dielectric such as aluminum nitride or aluminum oxide. The elastic member 272 may be interposed between the support ring 17 and the upper end of the processing container 10. By the elastic member 272, damage to the dielectric plate 18 is suppressed.

The introduction part 16 is a ring-shaped member. The introduction part 16 is formed of a dielectric such as aluminum nitride or aluminum oxide. The introduction part 16 is disposed outward of the peripheral edge portion of the dielectric plate 18 and the support ring 17, and extends in a circumferential direction around the axial line AX. The introduction part 16 is a portion that introduces radio frequency waves into the space SP. The radio frequency waves are VHF waves or UHF waves. The introduction part 16 is provided at a horizontal end portion of the space SP. The plasma processing apparatus 1 further includes a waveguide part 20 for supplying the radio frequency waves to the introduction part 16.

In one embodiment, the waveguide part 20 is composed of an inner member 22i and a tubular member 22t. The inner member 22i is formed of a conductor such as aluminum or an aluminum alloy. The inner member 22i has, for example, a substantially disk shape. The inner member 22i is provided above the upper electrode 14. The inner member 22i provides a space 22S (a gas diffusion space) between the upper electrode 14 and the inner member 22i, and constitutes a lid of one embodiment.

In one embodiment, a peripheral edge portion of the inner member 22i and the upper end of the processing container 10 elastically hold the peripheral edge portion of the upper electrode 14, the peripheral edge portion of the dielectric plate 18, and the support ring 17 via the elastic member 272. The elastic member 272 is, for example, an O-ring. In one embodiment, the introduction part 16 is elastically held between the peripheral edge portion of the inner member 22i and the upper end of the processing container 10. In one embodiment, a seal 25 is interposed between the upper end of the processing container 10 and the introduction part 16. Further, a seal 26 is interposed between the peripheral edge portion of the inner member 22i and the introduction part 16. Each of the seal 25 and the seal 26 has elasticity. Each of the seal 25 and the seal 26 extends in the circumferential direction around the axial line AX. Each of the seal 25 and the seal 26 is, for example, an O-ring.

The tubular member 22t includes an upper wall portion 221t and a cylindrical portion 223t. The upper wall portion 221t has a substantially disk shape and extends horizontally above the inner member 22i. The upper wall portion 221t is spaced apart from the inner member 22i. The cylindrical portion 223t has a substantially cylindrical shape. A central axial line of the cylindrical portion 223t substantially coincides with the axial line AX. The cylindrical portion 223t extends downward from a peripheral edge portion of the upper wall portion 221t. A lower end of the cylindrical portion 223t is connected to the upper end of the processing container 10. Therefore, the tubular member 22t is grounded. The cylindrical portion 223t is provided outside the inner member 22i in the radial direction with respect to the axial line AX so as to surround the inner member 22i. The cylindrical portion 223t is spaced apart from the inner member 22i.

The waveguide part 20 provides a waveguide 206 between the upper wall portion 221t and the upper surface of the inner member 22i. The waveguide part 20 provides a tubular waveguide 207 between the cylindrical portion 223t and the outer peripheral surface of the inner member 22i. The waveguide 206 is connected to an upper end of the waveguide 207. A lower end of the waveguide 207 is connected to the introduction part 16.

A radio frequency power supply 30 is electrically connected to the inner member 22i via a matching device 32. The radio frequency power supply 30 is a power supply that generates the above-mentioned radio frequency waves. The matching device 32 includes a matching circuit for matching an impedance of a load of the radio frequency power supply 30 with an output impedance of the radio frequency power supply 30. The radio frequency waves from the radio frequency power supply 30 are supplied to the introduction part 16 via the waveguide 206 and the waveguide 207. The radio frequency waves are supplied into the space SP via the introduction part 16. When the radio frequency waves are supplied to the space SP, a gas in the space SP is excited and plasma is generated from the gas. The substrate W is processed with chemical species from the plasma.

A pipe 40 is connected to the above-mentioned space 225. A gas supply 42 is connected to the pipe 40. The gas supply 42 includes one or more gas sources used for processing the substrate W. Further, the gas supply 42 includes one or more flow rate controllers for controlling flow rates of gases from the one or more gas sources.

The pipe 40 extends to the space 225 via the waveguide 206. The inner member 22i defining the waveguide 206 is not grounded. In order to prevent a gas from being excited in the pipe 40, the pipe 40 is surrounded by a member 401 in the waveguide 206. The member 401 is formed of an insulating material. Further, in order to increase a length of the member 401, the upper wall portion 221t is formed to protrude upward in a vicinity of the member 401.

In one embodiment, the space 225 is in communication with the gap 145 via the upper electrode 14. In one embodiment, the upper electrode 14 is provided with a plurality of through-holes 14h formed therein. The plurality of through-holes 14h brings the space 225 (that is, the gas diffusion space) and the gap 145 into communication with each other. In this embodiment, a gas from the gas supply 42 is supplied into the space 225 via the pipe 40 and is supplied from the space 225 into the gap 145 via the plurality of through-holes 14h. The gas supplied into the gap 145 is discharged into the space SP from the plurality of gas discharge holes 18h.

In one embodiment, a lower end opening of each of the plurality of through-holes 14h is disposed to face an upper end opening of a corresponding one of the plurality of gas discharge holes 18h. According to this embodiment, even when it is difficult for a gas to diffuse in the horizontal direction in the gap 145 due to a short length of the gap 145 in the vertical direction, the gas easily flows from each of the plurality of through-holes 14h to the corresponding gas discharge hole.

The plasma processing apparatus 1 further includes a driving shaft 47 and an actuator 46. The driving shaft 47 is coupled to the upper electrode 14 on the axial line AX. In one embodiment, the driving shaft 47 is a rod and extends in the vertical direction on the axial line AX. A lower end of the driving shaft 47 is coupled to a center of the upper electrode 14 in the radial direction. The actuator 46 is configured to move the driving shaft 47 in the vertical direction.

In one embodiment, a cavity 226 is formed in the inner member 22i. The actuator 46 may be accommodated in the cavity 226. The driving shaft 47 penetrates a portion of the inner member 22i from the cavity 226 and extends downward along the axial line AX. A seal 48 such as an O-ring may be provided between the driving shaft 47 and the inner member 22i.

In the plasma processing apparatus 1, when the driving shaft 47 is moved in the vertical direction by the actuator 46, the center of the upper electrode 14 moves in the vertical direction. As a result, the length of the gap 145 in the vertical direction is adjusted according to a distance from the axial line AX. Accordingly, intensity of an electric field formed by the radio frequency waves is adjusted according to a distance in the radial direction from the axial line AX. Therefore, a distribution of plasma density in the radial direction with respect to the axial line AX can be adjusted. For example, non-uniformity in the radial direction of the intensity of the electric field formed by the radio frequency waves is eliminated, thereby reducing non-uniformity of the plasma density distribution in the radial direction.

In one embodiment, as illustrated in FIG. 1, the length of the gap 145 in the vertical direction on the axial line AX is longer than the length of the gap 145 in the vertical direction at a location distanced from the axial line AX. For example, the length of the gap 145 in the vertical direction is expressed as a function of distance from the axial line AX and decreases as the distance from the axial line AX increases. In this example, a lower surface of the upper electrode 14 may extend along a conical surface. According to this embodiment, when radio frequency waves intensify each other on the axial line AX, the non-uniformity in the radial direction of the intensity of the electric field formed by the radio frequency waves can be reduced.

Hereinafter, a plasma processing method of performing plasma processing on a substrate by using the plasma processing apparatus 1 will be described. In the plasma processing method, a substrate is placed on the stage 12. Subsequently, in the plasma processing method, a gas is supplied into the space SP in the processing container 10. The gas is supplied from the gas supply 42 into the space SP. Subsequently, in the plasma processing method, radio frequency waves are introduced into the space SP. The radio frequency waves are introduced from the waveguide part 20 into the space SP via the introduction part 16. The radio frequency waves introduced into the space SP excite the gas in the space SP to generate plasma from the gas. The substrate is processed by the generated plasma. In this plasma processing method, the substrate is processed by plasma having a density distribution adjusted in the radial direction with respect to the axial line AX. In addition, this plasma processing method can be similarly carried out by using plasma processing apparatuses of various embodiments which will be described later.

Figure 3:
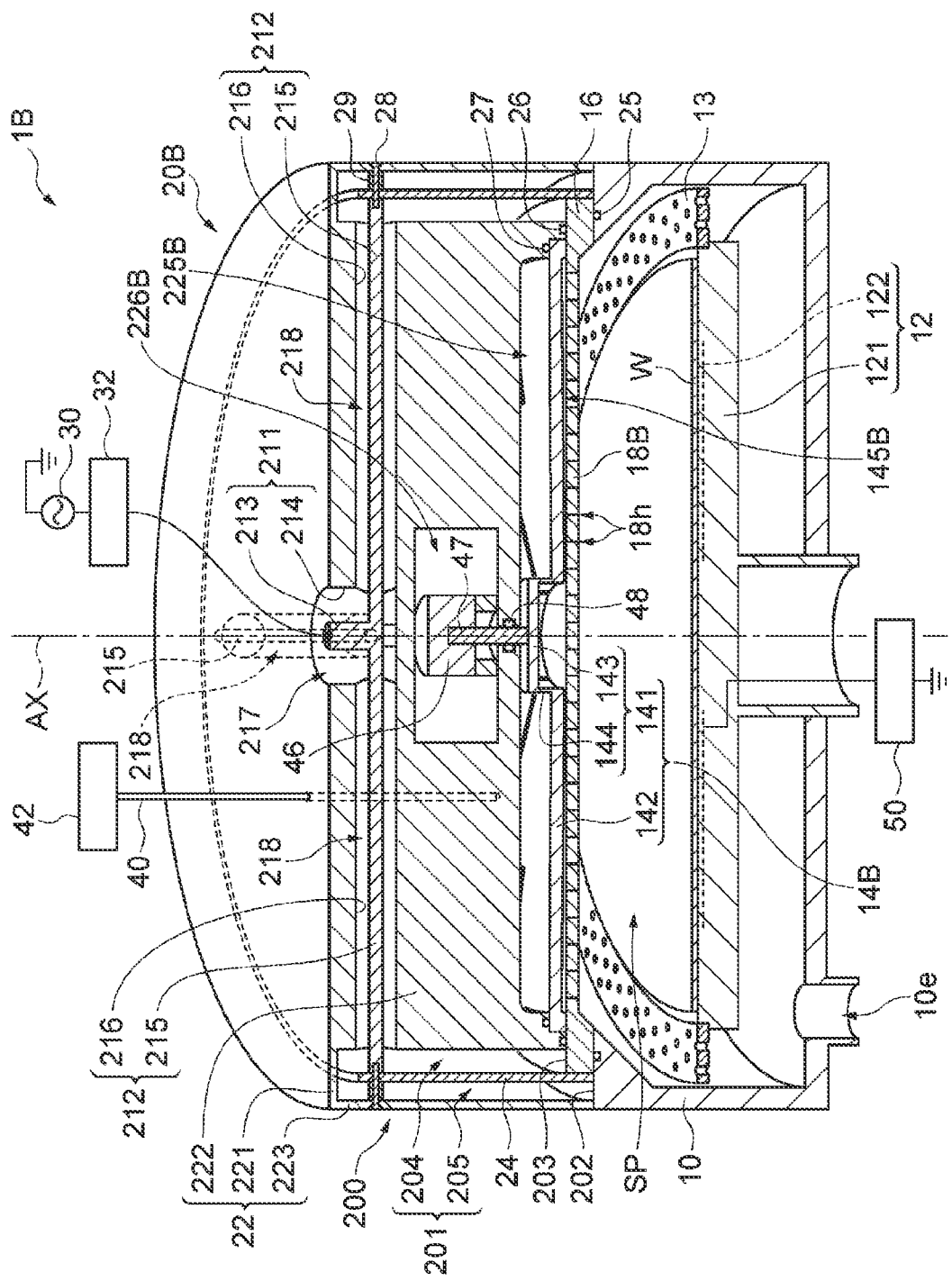
FIG. 3 is a view schematically illustrating a plasma processing apparatus according to another exemplary embodiment.

Hereinafter, a plasma processing apparatus 1B according to another exemplary embodiment will be described with reference to FIG. 3. FIG. 3 is a view schematically illustrating a plasma processing apparatus according to another exemplary embodiment. Hereinafter, a configuration of the plasma processing apparatus 1B different from the configuration of the plasma processing apparatus 1 will be described.

The plasma processing apparatus 1B includes an upper electrode 14B instead of the upper electrode 14, and a dielectric plate 18B instead of the dielectric plate 18. The dielectric plate 18B is provided above the stage 12 via the space SP in the processing container 10. The upper electrode 14B is provided above the dielectric plate 18B. The upper electrode 14B and the dielectric plate 18B are configured to provide a gap 145B therebetween. The upper electrode 14B is formed of a conductor such as aluminum or an aluminum alloy. The upper electrode 14B has flexibility. The upper electrode 14B can be formed of a plate member formed of a conductor. The upper electrode 14B may have a substantially circular planar shape. In one embodiment, a central axial line of the upper electrode 14B substantially coincides with the axial line AX. Details of the upper electrode 14B will be described later.

The dielectric plate 18B is formed of aluminum nitride, aluminum oxide, yttrium oxide, or a dielectric containing aluminum nitride, aluminum oxide, or yttrium oxide. A corrosion-resistant film may be formed on at least a lower surface of surfaces of the dielectric plate 18B. The corrosion-resistant film may be an yttrium oxide film, an yttrium oxyfluoride film, an yttrium fluoride film, or a ceramic film containing yttrium oxide or yttrium fluoride. The dielectric plate 18B has a substantially disk shape. A central axial line of the dielectric plate 18B substantially coincides with the axial line AX. Similar to the dielectric plate 18, the dielectric plate 18B is provided with a plurality of gas discharge holes 18h formed therein. That is, in one embodiment, the dielectric plate 18B may be a shower plate configured to discharge a gas. A distance in the vertical direction between the lower surface of the dielectric plate 18B and the upper surface of the stage 12 is, for example, 5 cm or more and 30 cm or less.

Even in the plasma processing apparatus 1B, the area of the inner wall surface of the processing container 10 extending above the baffle member 13 is substantially equal to a surface area of the dielectric plate 18B on the side of the space SP. That is, an area of a plane set to the ground potential (a ground plane) among planes defining the space SP is substantially equal to an area of a plane provided by the dielectric plate 18B among the planes defining the space SP.

A thickness of a peripheral edge portion of the dielectric plate 18B is larger than a thickness of a central portion of the dielectric plate 18B. The central portion of the dielectric plate 18B is a portion extending inward with respect to the peripheral edge portion of the dielectric plate 18B. The peripheral edge portion of the dielectric plate 18B constitutes the introduction part 16. That is, the introduction part 16 has an annular shape. The plasma processing apparatus 1B further includes a waveguide part 20B for supplying radio frequency waves to the introduction part 16.

In one embodiment, the waveguide part 20B includes a resonator 200. In one embodiment, the resonator 200 may be a cavity resonator. The resonator 200 provides a waveguide 201. The waveguide 201 extends in the circumferential direction around the axial line AX and extends in a direction in which the axial line AX extends. The waveguide 201 is connected to the introduction part 16. The waveguide 201 has a tubular shape extending along the vertical direction. A central axial line of the waveguide 201 substantially coincides with the axial line AX.

The waveguide 201 includes a first end 202 and a second end 203. A width of the waveguide 201 between the first end 202 and the second end 203 is set so that the resonator 200 is in a resonant state. That is, the width of the waveguide 201 is set so that a wavelength of electromagnetic waves propagating in the circumferential direction along the waveguide 201 becomes substantially infinite. In the present embodiment, since the inside of the waveguide 201 is hollow, the width of the waveguide 201 is about ½ of a wavelength (free space wavelength) of the radio frequency waves used. When a dielectric is provided inside the waveguide 201, the width of the waveguide 201 may be set to a value obtained by dividing ½ of the free space wavelength by a square root of the effective dielectric constant in the waveguide 201.

In one embodiment, the waveguide 201 includes an inner waveguide 204 and an outer waveguide 205. Each of the inner waveguide 204 and the outer waveguide 205 is a tubular waveguide extending along the vertical direction. The inner waveguide 204 extends inward of the outer waveguide 205 in the radial direction. A lower end of the outer waveguide 205 constitutes the first end 202 of the waveguide 201. An upper end of the outer waveguide 205 and an upper end of the inner waveguide 204 are continuous with each other. That is, the waveguide 201 is folded back in the direction in which the axial line AX extends. Further, the above-mentioned width of the waveguide 201 is the width of the folded waveguide 201 between the first end 202 and the second end 203. A lower end of the inner waveguide 204 constitutes the second end 203 of the waveguide 201. The second end 203 of the waveguide 201 is connected to the introduction part 16.

In one embodiment, the waveguide part 20B further includes a first coaxial waveguide pipe 211 and a plurality of second coaxial waveguide pipes 212. The first coaxial waveguide pipe 211 extends along the vertical direction so that a central axial line thereof substantially coincides with the axial line AX. That is, the first coaxial waveguide pipe 211 extends on the axial line AX. The first coaxial waveguide pipe 211 has an inner conductor 213. The radio frequency power supply 30 is electrically connected to the inner conductor 213 via the matching device 32.

One end of each of the plurality of second coaxial waveguide pipes 212 is connected to the first coaxial waveguide pipe 211. Each of the plurality of second coaxial waveguide pipes 212 extends from one end thereof along the radial direction with respect to the axial line AX and is connected to the waveguide 201 of the resonator 200. That is, a plurality of coaxial lines provided by the plurality of second coaxial waveguide pipes 212 are connected to the waveguide 201 of the resonator 200. The plurality of second coaxial waveguide pipes 212 is arranged at equal intervals in the circumferential direction with respect to the axial line AX, that is, at an angular interval of about 360 degrees/N. "N" is the number of second coaxial waveguide pipes 212. "N" is not particularly limited but is, for example, three or four.

In one embodiment, the waveguide 201 of the resonator 200 is provided by a main part 22 and a cylindrical member 24. The main part 22 is formed of a conductor such as aluminum or an aluminum alloy. The main part 22 includes an upper wall portion 221, a central portion 222, and an outer cylindrical portion 223. The upper wall portion 221 has a substantially circular and thin-plate shape. The upper wall portion 221 extends substantially horizontally. The central portion 222 has a substantially cylindrical shape. The central portion 222 extends downward from the upper wall portion 221. A lower surface of the central portion 222 defines a space 225B inside a peripheral edge portion of the central portion 222. The space 225B is a gas diffusion space.

The introduction part 16, that is, the peripheral edge portion of the dielectric plate 18B, is elastically held between the peripheral edge portion of the central portion 222 and the upper end of the processing container 10. Specifically, the seal 25 is interposed between the upper end of the processing container 10 and the lower surface of the introduction part 16. The seal 26 is interposed between the peripheral edge portion of the central portion 222 and the upper surface of the introduction part 16.

The peripheral edge portion of the upper electrode 14B is disposed inward of the seal 26 in the radial direction, and is sandwiched between the peripheral edge portion of the central portion 222 and the introduction part 16. A conductive elastic member 27, for example, a spiral ring, is provided between the peripheral edge portion of the upper electrode 14B and the peripheral edge portion of the central portion 222. The conductive elastic member 27 is formed of, for example, a metal such as stainless steel, Inconel, nickel, tungsten, tantalum, a copper alloy, or molybdenum. The conductive elastic member 27 may be covered with a protective film such as nickel, aluminum, stainless steel, or gold. The conductive elastic member 27 stably maintains an electrical connection between the upper electrode 14B and the central portion 222.

The outer cylindrical portion 223 has a substantially cylindrical shape. A central axial line of the outer cylindrical portion 223 substantially coincides with the axial line AX. The outer cylindrical portion 223 is disposed outward of the central portion 222 in the radial direction, and extends downward from the upper wall portion 221. The lower end of the outer cylindrical portion 223 is connected to the upper end of the processing container 10. Therefore, the main part 22 is grounded.

The cylindrical member 24 is formed of a conductor such as aluminum or an aluminum alloy. The cylindrical member 24 has a substantially cylindrical shape. A central axial line of the cylindrical member 24 substantially coincides with the axial line AX. The cylindrical member 24 extends in the vertical direction between the central portion 222 and the outer cylindrical portion 223. A lower end of the cylindrical member 24 is connected to the upper end of the processing container 10. Therefore, the cylindrical member 24 is grounded. An upper end of the cylindrical member 24 is spaced apart from the upper wall portion 221.

The outer waveguide 205 extends between the outer cylindrical portion 223 and the cylindrical member 24. The outer waveguide 205 is terminated at the upper end of the processing container 10. The outer waveguide 205 and the inner waveguide 204 are connected to each other between the upper end of the cylindrical member 24 and the upper wall portion 221. The inner waveguide 204 extends between the cylindrical member 24 and the central portion 222.

The central portion 222 of the main part 22 provides an outer conductor 214 of the first coaxial waveguide pipe 211 and outer conductors 216 of the plurality of second coaxial waveguide pipes 212. Specifically, a hole 217 extending along the axial line AX is formed in the central portion 222. A portion that defines the hole 217 in the central portion 222 is the outer conductor 214. The inner conductor 213 of the first coaxial waveguide pipe 211 extends along the central line of the hole 217, that is, the axial line AX.

A plurality of holes 218 extending in the radial direction with respect to the axial line AX is formed in the central portion 222. The plurality of holes 218 is arranged at an angular interval of about 360 degrees/N in the circumferential direction with respect to the axial line AX. As described above, "N" is the number of second coaxial waveguide pipes 212. Portions that define the plurality of holes 218 in the central portion 222 are the outer conductors 216. A plurality of inner conductors 215, that is, inner conductors of the plurality of second coaxial waveguide pipes 212, extends in the plurality of holes 218, respectively. The plurality of inner conductors 215 branches from the inner conductor 213 and extends in the radial direction with respect to the axial line AX. An end portion of each of the plurality of inner conductors 215 is connected to the upper end of the cylindrical member 24. Accordingly, the inner conductor 213 and the plurality of inner conductors 215 are grounded. Therefore, the waveguide provided by the waveguide part 20B is composed of a grounded conductor, that is, a metal wall of the grounded waveguide part 20B.

The end portion of each of the plurality of inner conductors 215 is connected to the upper end of the cylindrical member 24 by a screw 28. The screw 28 extends from the outer cylindrical portion 223 to the end portion of the corresponding one of the plurality of inner conductors 215, and is screwed onto the corresponding inner conductor 215. A head portion of the screw 28 is in contact with the outer cylindrical portion 223. The screw 28 is formed of an insulator. The screw 28 is formed of, for example, polytetrafluoroethylene. A plurality of spacers 29 is provided between the cylindrical member 24 and the outer cylindrical portion 223. Each of the plurality of spacers 29 surrounds a corresponding screw 28 at a location between the cylindrical member 24 and the outer cylindrical portion 223. Each of the plurality of spacers 29 is formed of an insulator. Each of the plurality of spacers 29 is formed of, for example, polytetrafluoroethylene.

Figure 4:
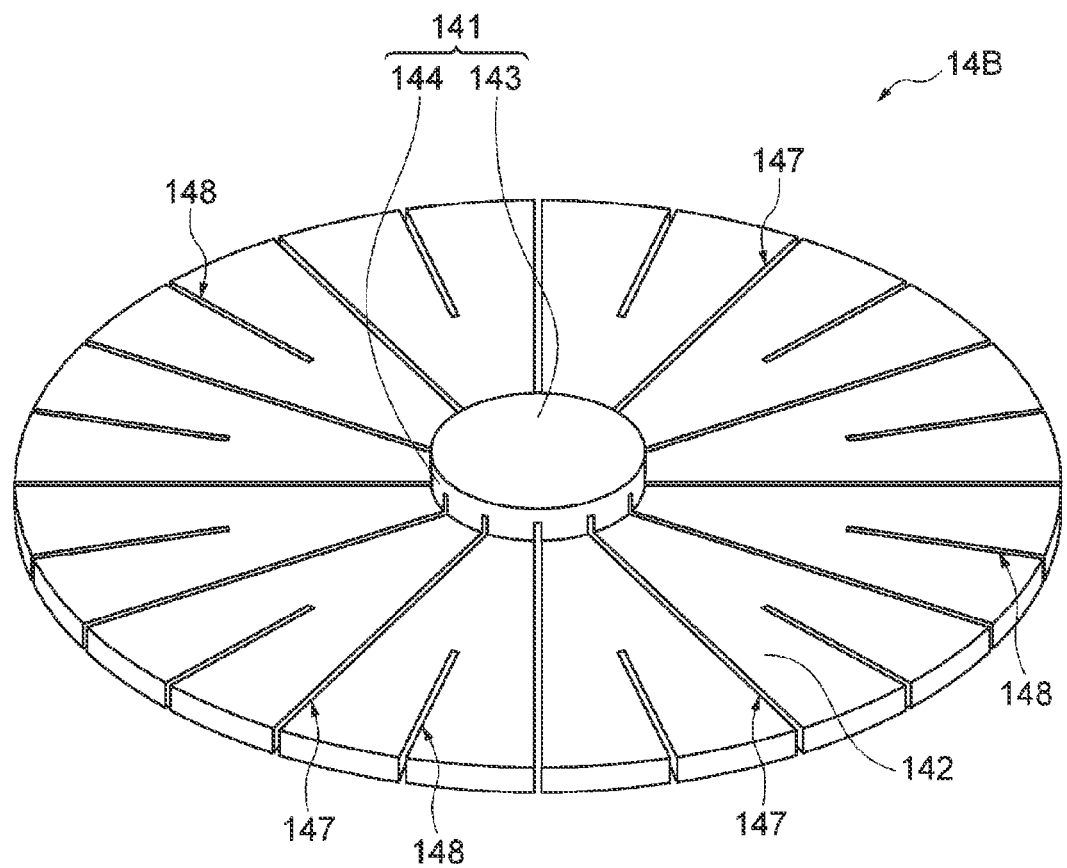
FIG. 4 is a perspective view illustrating an upper electrode according to one exemplary embodiment.

Hereinafter, FIG. 4 is referenced together with FIG. 3. FIG. 4 is a perspective view illustrating an upper electrode according to one exemplary embodiment. In one embodiment, the upper electrode 14B includes a first portion 141 and a second portion 142. The first portion 141 constitutes the central portion of the upper electrode 14B. The first portion 141 includes an upper wall 143 and a tubular wall 144. The upper wall 143 has a substantially disc shape. The upper wall 143 extends substantially horizontally. The tubular wall 144 has a substantially cylindrical shape. The tubular wall 144 extends downward from a peripheral edge portion of the upper wall 143. Further, a thickness (thickness in the radial direction) of the tubular wall 144 is smaller than a thickness of the upper wall 143 and a thickness of the second portion 142.

The second portion 142 has a substantially annular shape and is a plate shape. The second portion 142 extends in the radial direction from a lower end of the tubular wall 144. A peripheral edge portion of the second portion 142 is the peripheral edge portion of the upper electrode 14B. The lower surface of the upper electrode 14B defines the gap 145B between the lower surface thereof and the dielectric plate 18B and further inside the peripheral edge portion of the upper electrode 14B.

The upper electrode 14B is provided with a plurality of first slits 147 and a plurality of second slits 148, which are formed in the upper electrode 14B. The plurality of first slits 147 and the plurality of second slits 148 penetrate the upper electrode 14B. Each of the plurality of first slits 147 extends along the radial direction from the tubular wall 144 to the peripheral edge of the upper electrode 14B. The plurality of first slits 147 is arranged at an angular interval of 360 degrees/M in the circumferential direction, for example. "M" is the number of first slits 147.

Each of the plurality of second slits 148 extends along the radial direction from a location between the tubular wall 144 and the peripheral edge of the upper electrode 14B to the peripheral edge of the upper electrode 14B. The plurality of second slits 148 is arranged alternately with the plurality of first slits 147 in the circumferential direction.

The pipe 40 is connected to the above-mentioned space 225B. The gas supply 42 is connected to the pipe 40. The pipe 40 extends into the space 225B through the waveguide of the waveguide part 20B. As described above, all the waveguides provided by the waveguide part 20B are composed of grounded conductors. Therefore, excitation of a gas in the pipe 40 is suppressed.

The space 225B is connected to the gap 145B via the plurality of first slits 147 and the plurality of second slits 148. The gas from the gas supply 42 is supplied into the space 225B via the pipe 40. The gas supplied into the space 225B is supplied into the gap 145B via the plurality of first slits 147 and the plurality of second slits 148. The gas supplied into the gap 145B is discharged into the space SP via the plurality of gas discharge holes 18$h$ of the dielectric plate 18B.

In the plasma processing apparatus 1B, radio frequency waves are supplied from the radio frequency power supply 30 to the introduction part 16 via the waveguide of the waveguide part 20B. The resonator 200 of the waveguide part 20B provides the waveguide 201, which extends in the direction in which the axial line AX extends and extends in the circumferential direction around the axial line AX. The waveguide 201 is connected to the introduction part 16 extending in the circumferential direction. The radio frequency waves are introduced into the space SP from the introduction part 16 toward the axial line AX. Since the resonator 200 provides the waveguide 201 having the above-mentioned width, the guide wavelength along the longitudinal direction (the circumferential direction of the axial line AX) of the waveguide 201 becomes infinite. As a result, an electric field having uniform intensity and phase in the circumferential direction is applied to the introduction part 16. Accordingly, radio frequency waves with uniform power in the circumferential direction is introduced into the space SP from the introduction part 16. When the radio frequency waves are introduced into the space SP, a gas is excited in the space SP to generate plasma from the gas. Accordingly, plasma is generated in the space SP with a uniform density distribution in the circumferential direction. The substrate W on the stage 12 is processed with chemical species from the plasma.

The above-mentioned gap 145B includes a sub-space defined by the first portion 141 and a sub-space defined by the second portion 142. A length in the vertical direction of the sub-space defined by the first portion 141 is longer than a length in the vertical direction of the sub-space defined by the second portion 142. Accordingly, non-uniformity in the radial direction of the intensity of the electric field formed by the radio frequency waves is reduced.

In one embodiment, a cavity 226B is formed in the central portion 222 of the waveguide part 20B. The actuator 46 is accommodated in the cavity 226B. The driving shaft 47 extends downward from the actuator 46 along the axial line AX through the central portion 222. A seal 48 such as an O-ring is provided between the driving shaft 47 and the central portion 222. The driving shaft 47 is connected to the upper wall 143 of the first portion 141 of the upper electrode 14B. The actuator 46 generates power to move the upper wall 143 vertically. When the upper wall 143 is moved upward by the actuator 46, a length of the gap 145B in the vertical direction increases according to a length of a distance from the axial line AX. That is, by adjusting the position of the upper wall 143 in the vertical direction by the actuator 46, the length of the gap 145B in the vertical direction is adjusted according to the distance from the axial line AX. Accordingly, the intensity of the electric field formed by the radio frequency waves is adjusted according to the distance in the radial direction from the axial line AX. Therefore, the distribution of plasma density in the radial direction with respect to the axial line AX can be adjusted. For example, non-uniformity in the radial direction of the intensity of the electric field formed by the radio frequency waves can be eliminated, so that non-uniformity of the plasma density distribution in the radial direction can be reduced.

As described above, the thickness of the tubular wall 144 of the upper electrode 14B is thin. Accordingly, the upper electrode 14B is easily bent. Further, in the upper electrode 14B, the plurality of first slits 147 and the plurality of second slits 148 described above are formed. Accordingly, the upper electrode 14B is more easily bent.

Figure 5:
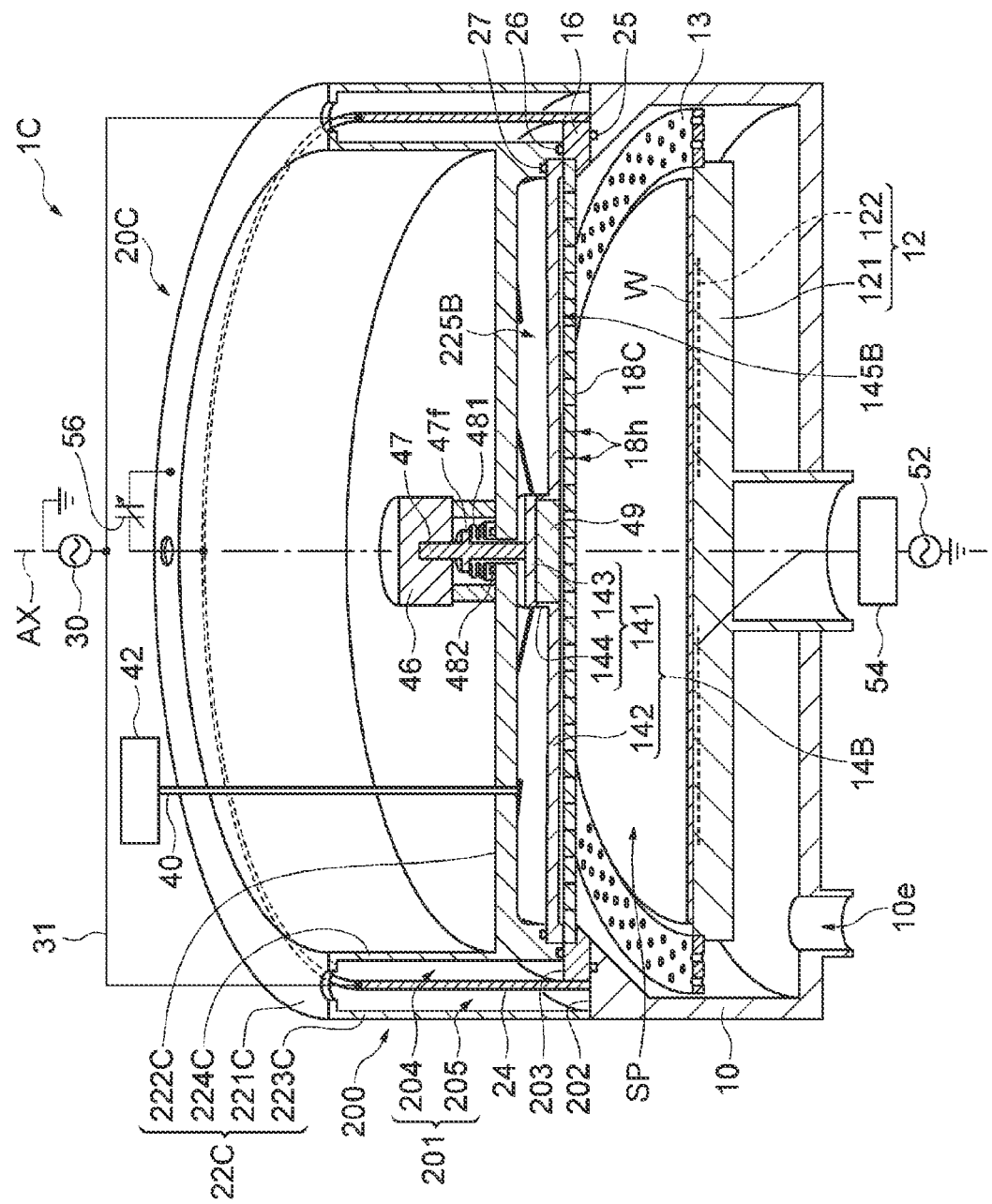
FIG. 5 is a view schematically illustrating a plasma processing apparatus according to yet another exemplary embodiment.

Hereinafter, a plasma processing apparatus 1C according to yet another exemplary embodiment will be described with reference to FIG. 5. FIG. 5 is a view schematically illustrating a plasma processing apparatus according to another exemplary embodiment. Hereinafter, a configuration of the plasma processing apparatus 1C, which is different from the configuration of the plasma processing apparatus 1B, will be described.

The plasma processing apparatus 1C includes a dielectric plate 18C instead of the dielectric plate 18B. The dielectric plate 18C is formed of aluminum nitride, aluminum oxide, yttrium oxide, or a dielectric containing aluminum nitride, aluminum oxide, or yttrium oxide. A corrosion-resistant film may be formed on at least a lower surface of surfaces of the dielectric plate 18C. The corrosion-resistant film may be an yttrium oxide film, an yttrium oxyfluoride film, an yttrium fluoride film, or a ceramic film containing yttrium oxide or yttrium fluoride. Similar to the dielectric plate 18B, the dielectric plate 18C is provided with a plurality of gas discharge holes 18$h$ formed therein. That is, in one embodiment, the dielectric plate 18C may be a shower plate configured to discharge a gas. The dielectric plate 18C has a substantially disk shape.

Even in the plasma processing apparatus 1C, the area of the inner wall surface of the processing container 10 extending above the baffle member 13 is substantially equal to a surface area of the dielectric plate 18C on the side of the space SP. That is, an area of a plane set to the ground potential (a ground plane) among planes defining the space SP is substantially equal to an area of a plane provided by the dielectric plate 18C among the planes defining the space SP.

In the plasma processing apparatus 1C, the introduction part 16 is a body separate from the dielectric plate 18C. In the plasma processing apparatus 1C, the introduction part 16 is a ring-shaped member. The introduction part 16 is formed of a dielectric material such as aluminum nitride or aluminum oxide.

The plasma processing apparatus 1C includes a waveguide part 20C instead of the waveguide part 20B. The waveguide part 20C has a main part 22C and a cylindrical member 24. The main part 22C is formed of a conductor such as aluminum or an aluminum alloy. The main part 22C includes an upper wall portion 221C, a central portion 222C, an outer cylindrical portion 223C, and an inner cylindrical portion 224C.

The upper wall portion 221C has a substantially annular shape and is a plate shape. A central axial line of the upper wall portion 221C substantially coincides with the axial line AX. The outer cylindrical portion 223C and the inner cylindrical portion 224C have a substantially cylindrical shape. A central axial line of each of the outer cylindrical portion 223C and the inner cylindrical portion 224C substantially coincide with the axial line AX. The inner cylindrical portion 224C is provided inward of the outer cylindrical portion 223C in the radial direction. The inner cylindrical portion 224C extends downward from an inner peripheral edge of the upper wall portion 221C. The outer cylindrical portion 223C extends downward from an outer peripheral edge of the upper wall portion 221C. The cylindrical member 24 extends between the outer cylindrical portion 223C and the inner cylindrical portion 224C. The upper end of the cylindrical member 24 is spaced apart from the upper wall portion 221C.

The waveguide part 20C constitutes the resonator 200. The inner waveguide 204 of the resonator 200 extends between the inner cylindrical portion 224C and the cylindrical member 24. The outer waveguide 205 of the resonator 200 extends between the outer cylindrical portion 223C and the cylindrical member 24. The outer waveguide 205 and the inner waveguide 204 are connected to each other via a gap between the upper end of the cylindrical member 24 and the upper wall portion 221C. The inner waveguide 204 is connected to the introduction part 16. The introduction part 16 is sandwiched between a peripheral edge portion of the central portion 222C and the upper end of the processing container 10 via the seal 25 and the seal 26. The central portion 222C has a substantially disk shape. The central portion 222C extends radially inward from a lower end of the inner cylindrical portion 224C. The central portion 222C and the upper electrode 14B provide the space 225B therebetween. The central portion 222C constitutes a lid of one embodiment.

In the plasma processing apparatus 1C, the radio frequency power supply 30 is electrically connected to the cylindrical member 24. In one embodiment, the radio frequency power supply 30 is electrically connected to the upper portion of the cylindrical member 24 via a coaxial cable 31. A variable capacitor 56 is connected between the cylindrical member 24 and the main part 22C. A capacitance of the variable capacitor 56 is adjusted to cause radio frequency resonance in the resonator 200. Since the variable capacitor 56 is used in the plasma processing apparatus 1C, the radio frequency power supply 30 may be electrically connected to the cylindrical member 24 without going through a matching device.

The plasma processing apparatus 1C may further include a dielectric member 49. The dielectric member 49 is provided in a space surrounded by the upper wall 143 and the tubular wall 144 of the first portion 141 of the upper electrode 14B so as to fill the space. The dielectric member 49 suppresses occurrence of electric discharge in the space.

In the plasma processing apparatus 1C, the driving shaft 47 has a flange 47f. The flange 47f is provided between the upper end and the lower end of the driving shaft 47. A bellows 481 is provided between the flange 47f and the central portion 222C. The bellows 481 may be formed of, for example, aluminum, an aluminum alloy, or stainless steel. A seal 482 such as an O-ring is provided between the bellows 481 and the central portion 222C.

In the plasma processing apparatus 1C, the conductive layer 122 of the stage 12 is a radio frequency electrode. A radio frequency power supply 52 is electrically connected to the conductive layer 122 via a matching device 54. The matching device 54 includes a matching circuit for matching a load impedance of the radio frequency power supply 52 with an output impedance of the radio frequency power supply 52.

Figure 6:
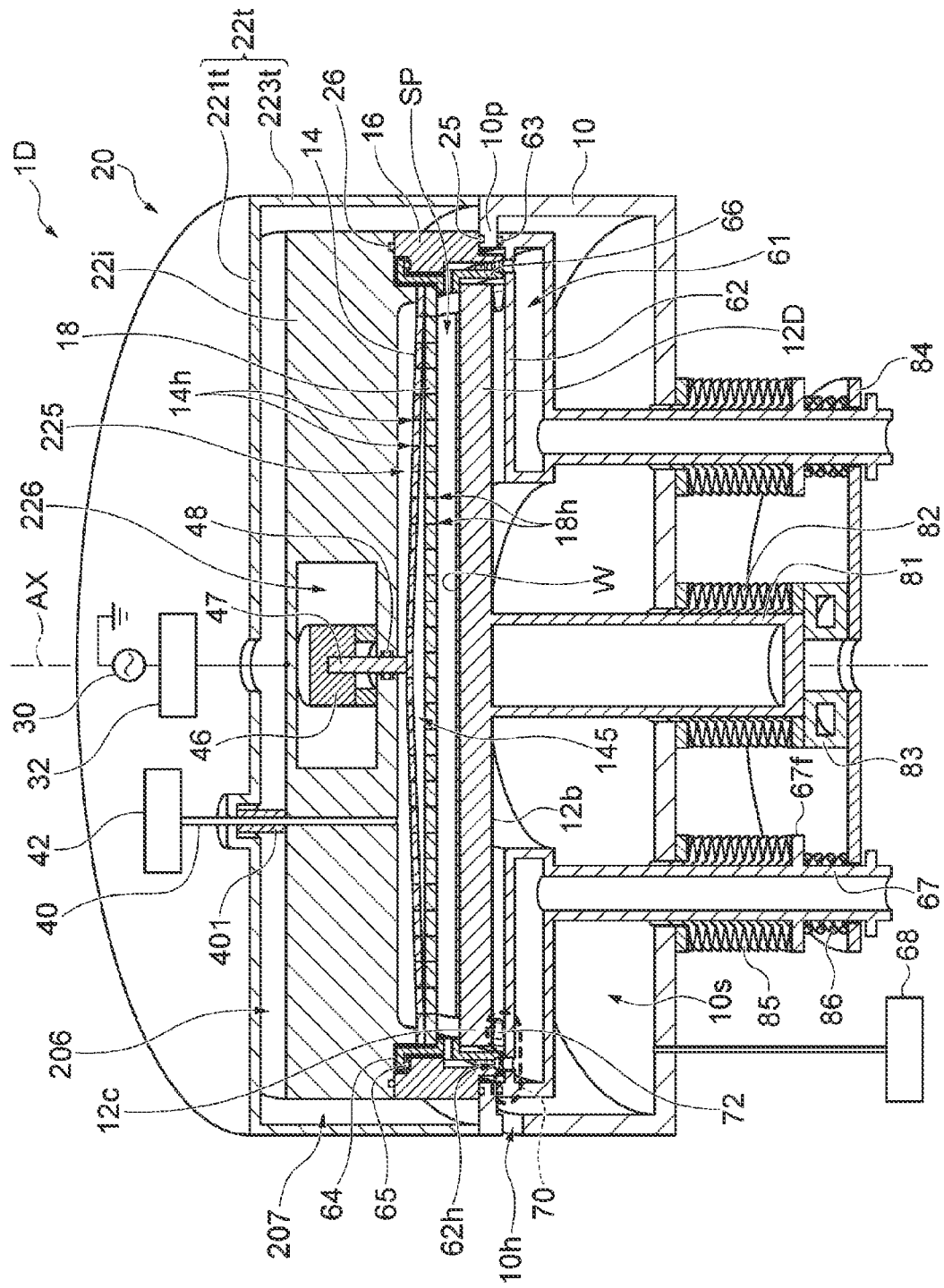
FIG. 6 is a view schematically illustrating a plasma processing apparatus according to still another exemplary embodiment.
Figure 7:
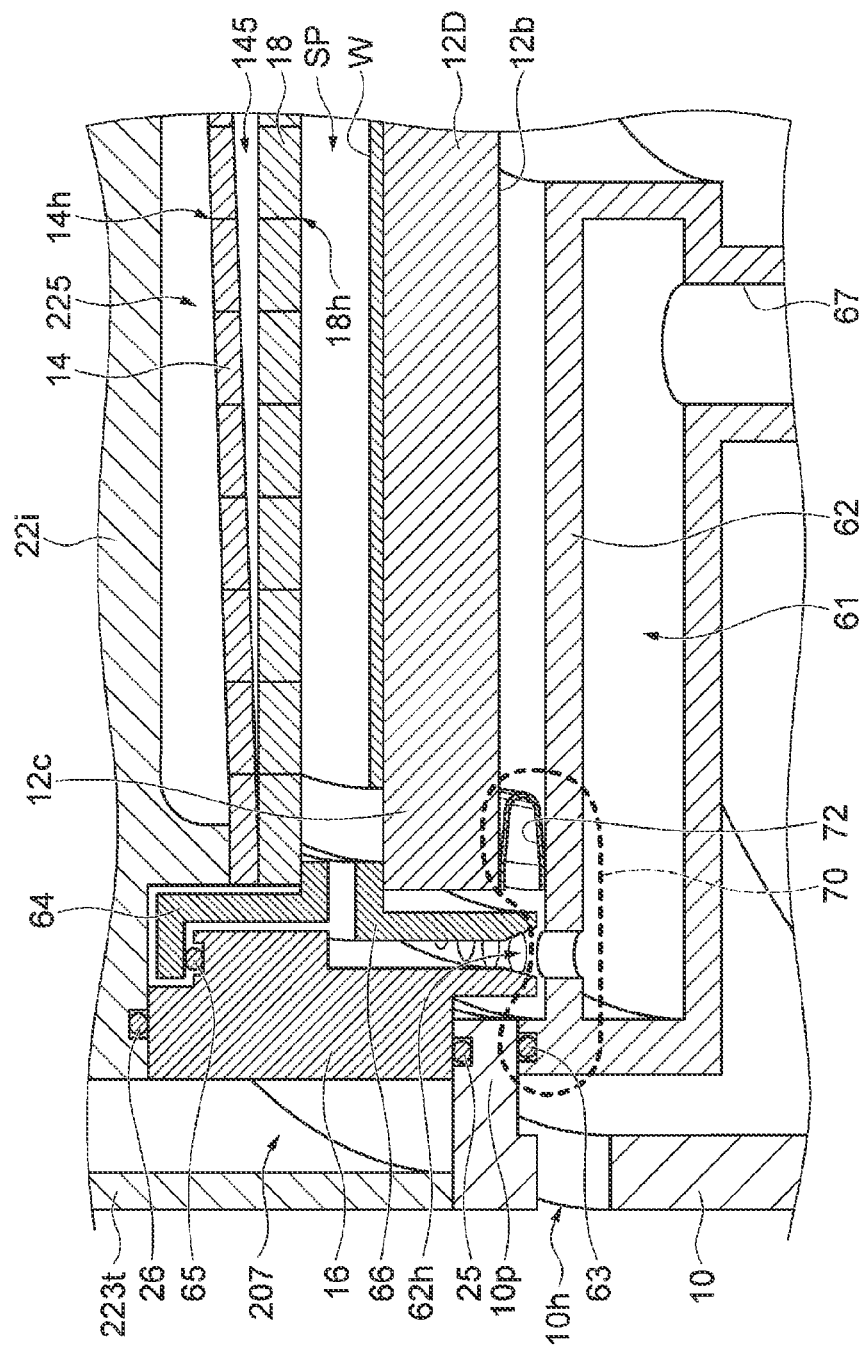
FIG. 7 is a partially enlarged view of the plasma processing apparatus of the exemplary embodiment illustrated in FIG. 6.

Hereinafter, a plasma processing apparatus 1D according to still another exemplary embodiment will be described with reference to FIGS. 6 and 7. FIG. 6 is a view schematically illustrating a plasma processing apparatus according to still another exemplary embodiment. FIG. 7 is a partially enlarged view of the plasma processing apparatus according to the exemplary embodiment illustrated in FIG. 6. Hereinafter, a configuration of the plasma processing apparatus 1D different from the configuration of the plasma processing apparatus 1 will be described.

In the plasma processing apparatus 1D, the sidewall of the processing container 10 has a protrusion 10p. The protrusion 10p constitutes the upper end of the sidewall of the processing container 10. The protrusion 10p extends in a direction intersecting the axial line AX toward the axial line AX.

The protrusion 10p is connected to a wall portion 62 via a conductive elastic member 63. The wall portion 62 has conductivity. The wall portion 62 may be formed of metal such as aluminum or an aluminum alloy. The conductive elastic member 63 is an elastic body. The conductive elastic member 63 is formed of, for example, metal such as stainless steel, Inconel, nickel, tungsten, tantalum, a copper alloy, or molybdenum. The conductive elastic member 63 may be covered with a protective film such as nickel, aluminum, stainless steel, or gold. The conductive elastic member 63 is, for example, a spiral ring. The wall portion 62 defines an exhaust chamber 61.

The introduction part 16 is provided on the protrusion 10p. As described above, the introduction part 16 is formed of a dielectric material such as aluminum nitride or aluminum oxide. The introduction part 16 has a ring shape. The introduction part 16 is provided at a horizontal end portion of the space SP. The introduction part 16 is held between the upper end (that is, the protrusion 10p) of the processing container 10 and the inner member 22i via the seal 25 and the seal 26.

The plasma processing apparatus 1D includes a stage 12D instead of the stage 12. The stage 12D is provided inside the processing container 10. The stage 12D is configured to substantially horizontally support the substrate W placed on the upper surface thereof. The stage 12D has a substantially disk shape. A central axial line of the stage 12D substantially coincides with the axial line AX. In the plasma processing apparatus 1D, a distance in the vertical direction (a length of the space SP in the vertical direction) between the lower surface of the dielectric plate 18 and an upper surface of the stage 12D may be, for example, 5 mm or more and 15 mm or less.

The plasma processing apparatus 1D further includes a support ring 64. The support ring 64 is a member that brings the peripheral edge portion of the dielectric plate 18 into close contact with the upper electrode 14. The support ring 64 is formed of an insulating material such as aluminum oxide. The support ring 64 is held between the inner member 22*i* and the introduction part 16. An elastic member 65 is interposed between the support ring 64 and the introduction part 16. Accordingly, the dielectric plate 18 is elastically held between the upper electrode 14 and the introduction part 16. The elastic member 65 is, for example, an O-ring.

The plasma processing apparatus 1D further includes a cover ring 66. The cover ring 66 is a member that holds the position of the stage 12D. The cover ring 66 is formed of an insulating material such as aluminum oxide. The cover ring 66 prevents plasma from being generated in a vicinity of a side surface of the stage 12D.

In the example illustrated in FIGS. 6 and 7, the stage 12D may be formed of a conductive material such as aluminum or an aluminum alloy.

The plasma processing apparatus 1D further includes a conductive part 70. The conductive part 70 extends between the peripheral edge portion 12*c* of the stage 12D and the sidewall of the processing container 10. The conductive part 70 is electrically connected to the peripheral edge portion 12*c* of the stage 12D and the sidewall of the processing container 10.

The conductive part 70 extends from the peripheral edge portion 12*c* toward the sidewall of the processing container 10 so that the radio frequency waves radiated from the introduction part 16 are introduced into the space SP. The conductive part 70 includes a conductive plate 72. The conductive part 70 includes a portion of the wall portion 62 that defines the exhaust chamber 61.

The conductive plate 72 is in electrical contact with a back surface 12*b* in the peripheral edge portion 12*c* of the stage 12D. The conductive plate 72 is a flexible thin plate. The conductive plate 72 is formed of, for example, a conductive material such as aluminum, an aluminum alloy, stainless steel, Inconel, nickel, tungsten, tantalum, a copper alloy, or molybdenum. The conductive plate 72 may be coated with a protective film such as aluminum oxide, yttrium oxide, yttrium oxyfluoride fluoride, yttrium fluoride, nickel, aluminum, stainless steel, or gold. The conductive plate 72 is fixed to the back surface (the back surface 12*b*) of the peripheral edge portion 12*c* and the upper surface of the wall portion 62 by a screw.

As described above, the wall portion 62 defines the exhaust chamber 61. The exhaust chamber 61 extends from a vicinity of the peripheral edge portion 12*c* toward the sidewall of the processing container 10. The exhaust chamber 61 is in communication with the space SP. The exhaust chamber 61 is in communication with an exhaust pipe 67.

The exhaust pipe 67 is connected to an exhaust device. The exhaust device is provided outside the processing container 10. The exhaust device may include a pressure control valve and a vacuum pump such as a turbo molecular pump and/or a dry pump.

A plurality of vent holes 62*h* are formed in the wall portion 62. The space SP is in communication with the exhaust chamber 61 via the plurality of vent holes 62*h*. A gas in the space SP can move to the exhaust chamber 61 via the vent holes 62*h* and can be discharged to the outside of the processing container 10 via the exhaust pipe 67.

An opening 10*h* is formed on the sidewall of the processing container 10. The substrate W is transferred between the inside and the outside of the processing container 10 via the opening 10*h*. An inner space 10*s* of the processing container 10 is in communication with the outside of the processing container 10 via the opening 10*h* and is also in communication with a gas supply device 68. The gas supply device 68 may supply a purge gas such as an Ar gas into the space 10*s*.

The plasma processing apparatus 1D further includes a support 81. The support 81 is connected to the stage 12D. The stage 12D is provided on the support 81. The support 81 penetrates a bottom of the processing container 10 and extends below the processing container 10. By moving the support 81 vertically, the stage 12D is moved vertically.

A water cooling plate 83 is disposed below the support 81. The support 81 is in contact with the water cooling plate 83. The water cooling plate 83 is mounted on a bottom plate 84. The bottom plate 84 has a substantially disk shape. Heat of the stage 12D can be discharged to the outside via the support 81 and the water cooling plate 83. A bellows 82 is provided between the water cooling plate 83 and the bottom of the processing container 10. The bellows 82 extends so as to surround the support 81. The bellows 82 seals an opening at the bottom of the processing container 10 through which the support 81 passes.

The exhaust pipe 67 is connected to the wall portion 62 and is in communication with the exhaust chamber 61. The wall portion 62 is provided on the exhaust pipe 67. A gas in the exhaust chamber 61 can be discharged to the outside via the exhaust pipe 67. The exhaust pipe 67 penetrates the bottom of the processing container 10 and the bottom plate 84, and extends below the processing container 10. By moving the exhaust pipe 67 vertically, the exhaust chamber 61 and the wall portion 62 are moved vertically.

The exhaust pipe 67 has a flange 67*f* between an upper end and a lower end thereof. A bellows 85 is provided between the flange 67*f* and the bottom of the processing container 10. The bellows 85 extends so as to surround the exhaust pipe 67. The bellows 85 seals an opening at the bottom of the processing container 10 through which the exhaust pipe 67 passes. The bellows 85 may be formed of a conductive material such as stainless steel. A spring 86 is provided between the flange 67*f* and the bottom plate 84. The spring 86 may be formed of a conductive material such as stainless steel.

The wall portion 62 is biased upward by the spring 86. That is, the wall portion 62 can be stably disposed on a side of the upper electrode 14 (upward) due to the elasticity of the spring 86. Accordingly, the peripheral edge portion of the wall portion 62 is in close contact with the back surface of the protrusion 10*p*. Further, due to the elasticity of the conductive elastic member 63, the peripheral edge portion of the wall portion 62 and the protrusion 10*p* can be stably in electrical contact with each other.

When plasma processing using the plasma processing apparatus 1D is performed, radio frequency waves are introduced from the introduction part 16 into the space SP in a state where the peripheral edge portion 12*c* of the stage 12D and the sidewall of the processing container 10 are electrically connected via the conductive part 70. The plasma processing is performed by plasma generated by an electric field based on the radio frequency introduced as described above.

In the plasma processing apparatus 1D, the conductive part 70 is connected to the sidewall of the processing container 10 and is therefore grounded. Accordingly, the conductive part 70 can have an electrical shielding function. The conductive part 70 extends between the peripheral edge portion 12*c* of the stage 12D and the sidewall of the processing container 10. Therefore, the radio frequency waves radiated from the introduction part 16 toward the space SP can be efficiently introduced into the space SP without being diffused to a region spreading below the stage 12D. As a result, the space SP can be supplied with radio frequency waves of sufficient intensity.

In one embodiment, the conductive part 70 is in electrical contact with the peripheral edge portion 12c of the stage 12D via the flexible conductive plate 72. Accordingly, even when a location of the conductive part 70 changes, the electrical contact between the conductive part 70 and the peripheral edge portion 12c of the stage 12D can be reliably maintained.

Figure 8:
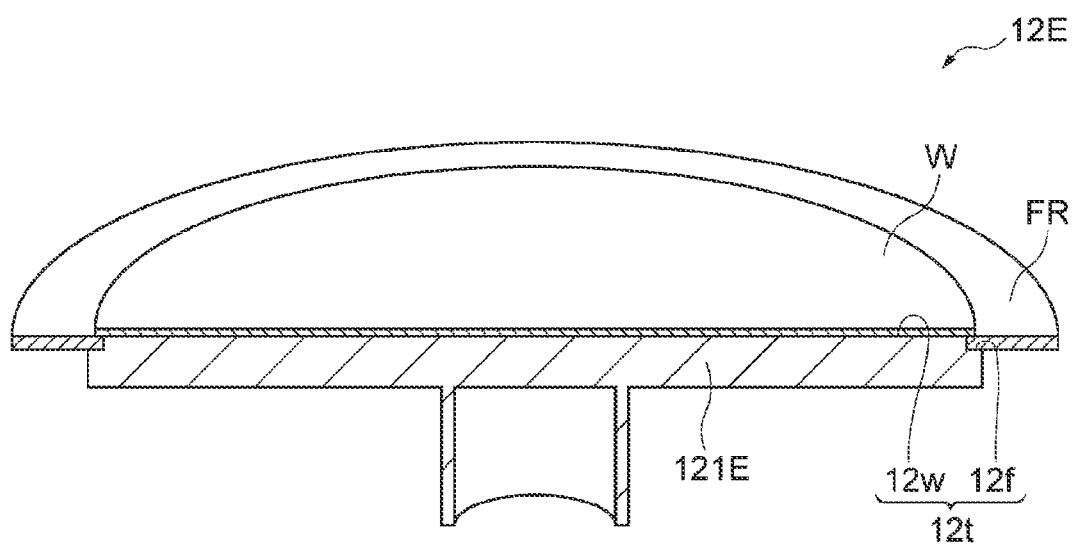
FIG. 8 is a broken perspective view illustrating a stage according to another exemplary embodiment.

Hereinafter, a stage 12E according to another exemplary embodiment will be described with reference to FIG. 8. FIG. 8 is a broken perspective view illustrating a stage according to another exemplary embodiment. The stage 12E illustrated in FIG. 8 can be used as a stage of each of the plasma processing apparatus 1, the plasma processing apparatus 1B, and the plasma processing apparatus 1C.

The stage 12E has a main body 121E. The main body 121E is formed of metal such as aluminum or an aluminum alloy. The main body 121E has a substantially disk shape. A central axial line of the main body 121E substantially coincides with the axial line AX.

An upper surface 12t of the main body 121E includes a substrate mounting region 12w and a focus ring mounting region 12f. The substrate mounting region 12w is a substantially circular region. The substrate W is mounted on the substrate mounting region 12w. A diameter of the substrate mounting region 12w is smaller than the diameter of the substrate W. The focus ring mounting region 12f extends in the radial direction and the circumferential direction at a location outward of the substrate mounting region 12w. A location in the vertical direction of the focus ring mounting region 12f is lower than a location in the vertical direction of the substrate mounting region 12w.

A focus ring FR is mounted on the focus ring mounting region 12f. The focus ring FR has a substantially annular shape and is a plate shape. The focus ring FR is formed of aluminum oxide or quartz. The focus ring FR is mounted on the focus ring mounting region 12f so that an upper surface of an inner periphery thereof faces a lower surface of an edge of the substrate W.

According to the stage 12E, generation of a radio frequency electric field between a central portion and an outer peripheral portion of the stage 12E is suppressed by the focus ring FR.

Figure 9:
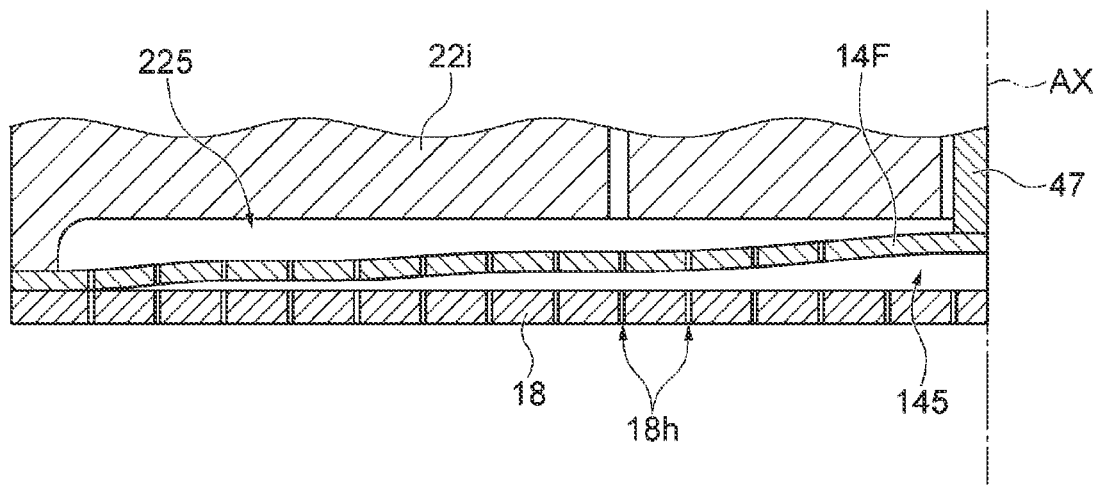
FIG. 9 is a partially enlarged cross-sectional view of an upper electrode according to another exemplary embodiment.

Hereinafter, an upper electrode 14F according to another exemplary embodiment will be described with reference to FIG. 9. FIG. 9 is a partially enlarged cross-sectional view of an upper electrode according to another exemplary embodiment. The upper electrode 14F illustrated in FIG. 9 can be used as the upper electrode 14 of each of the plasma processing apparatus 1 and the plasma processing apparatus 1D.

As illustrated in FIG. 9, a length of the gap 145 in the vertical direction may vary depending on a location thereof in the radial direction with respect to the axial line AX. According to this embodiment, influence of harmonic waves caused by non-linear current-voltage characteristics of a plasma sheath can be reduced. In one embodiment, as illustrated in FIG. 9, a lower surface of the upper electrode 14F may be wavy in any cross section including the axial line AX. Even in each of the plasma processing apparatus 1B and the plasma processing apparatus 1C, the length of the gap 145B in the vertical direction may vary depending on a location in the radial direction with respect to the axial line AX.

Although various exemplary embodiments have been described above, various omissions, substitutions, and changes may be made without being limited to the above-described exemplary embodiments. It is also possible to combine elements in different embodiments to form other embodiments.

In another exemplary embodiment, a length of the gap 145 (or the gap 145B) in the vertical direction on the axial line AX may be shorter than a length of the gap 145 (or the gap 145B) in the vertical direction at a location distanced from the axial line AX. For example, the length of the gap 145 (or the gap 145B) in the vertical direction is expressed as a function of a distance from the axial line AX and may increase as the distance from the axial line AX increases. According to this embodiment, attenuation of the radio frequency waves accompanying the propagation from the introduction part 16 toward the axial line AX can be suppressed.

From the above description, it is to be understood that the various embodiments of the present disclosure are described herein for purposes of explanation and that various modifications can be made without departing from the scope and spirit of the present disclosure. Therefore, the various embodiments disclosed herein are not intended to be limiting, and the true scope and spirit are set forth by the appended claims.

EXPLANATION OF REFERENCE NUMERALS

1: processing container, 12: stage, 14: upper electrode, 16: introduction part, 18: dielectric plate, 46: actuator, 47: driving shaft, 145: gap

What is claimed is:

1. A plasma processing apparatus comprising:
 a processing container;
 a stage provided in the processing container;
 a dielectric plate provided above the stage via a space in the processing container;
 an upper electrode having flexibility and being provided above the dielectric plate, the upper electrode being configured to provide a gap between the dielectric plate and the upper electrode;
 an introduction part of radio frequency waves that are VHF waves or UHF waves, the introduction part being provided at a horizontal end portion of the space;
 a driving shaft that is a central axial line of the processing container extending in a vertical direction and is coupled to the upper electrode on the central axial line including a center of the stage; and
 an actuator configured to move the driving shaft in the vertical direction.

2. The plasma processing apparatus of claim 1, further comprising:
 an elastic member interposed between a peripheral edge portion of the dielectric plate and the processing container,
 wherein the peripheral edge portion of the dielectric plate is elastically supported between the processing container and the upper electrode via the elastic member.

3. The plasma processing apparatus of claim 2, wherein a plurality of slits extending to a peripheral edge portion of the upper electrode along a radial direction with respect to the central axial line is formed in the upper electrode.

4. The plasma processing apparatus of claim 3, wherein a length of the gap in the vertical direction on the central axial line is longer than a length of the gap in the vertical direction at a location distanced from the central axial line.

5. The plasma processing apparatus of claim 4, wherein a length of the gap in the vertical direction varies depending on a location in the radial direction with respect to the central axial line.

6. The plasma processing apparatus of claim 5, wherein a lower surface of the upper electrode is wavy in an arbitrary cross section including the central axial line.

7. The plasma processing apparatus of claim 6, wherein a plurality of gas discharge holes configured to discharge a gas, which is supplied into the gap, into the space is formed in the dielectric plate.

8. The plasma processing apparatus of claim 7, further comprising:
a lid provided above the upper electrode, the lid providing a gas diffusion space between the upper electrode and the lid; and
a seal provided between the lid and the driving shaft,
wherein the diffusion space is in communication with the gap via the upper electrode, and
wherein the driving shaft is connected to the actuator through at least a portion of the lid.

9. The plasma processing apparatus of claim 8, wherein the seal is an O-ring.

10. The plasma processing apparatus of claim 9, wherein a plurality of through-holes bringing the diffusion space and the gap into communication with each other is formed in the upper electrode, and
wherein the plurality of through-holes is disposed so that a lower end opening of each of the plurality of through-holes faces an upper end opening of a corresponding one of the plurality of gas discharge holes.

11. The plasma processing apparatus of claim 8, wherein the seal is a bellows provided between the lid and the driving shaft.

12. The plasma processing apparatus of claim 8, wherein a plurality of through-holes bringing the diffusion space and the gap into communication with each other is formed in the upper electrode, and
wherein the plurality of through-holes is disposed so that a lower end opening of each of the plurality of through-holes faces an upper end opening of a corresponding one of the plurality of gas discharge holes.

13. The plasma processing apparatus of claim 1, wherein a plurality of slits extending to a peripheral edge portion of the upper electrode along a radial direction with respect to the central axial line is formed in the upper electrode.

14. The plasma processing apparatus of claim 1, wherein a length of the gap in the vertical direction on the central axial line is longer than a length of the gap in the vertical direction at a location distanced from the central axial line.

15. The plasma processing apparatus of claim 1, wherein a length of the gap in the vertical direction on the central axial line is shorter than a length of the gap in the vertical direction at a location distanced from the central axial line.

16. The plasma processing apparatus of claim 1, wherein a length of the gap in the vertical direction varies depending on a location in the radial direction with respect to the central axial line.

17. The plasma processing apparatus of claim 1, wherein a plurality of gas discharge holes configured to discharge a gas, which is supplied into the gap, into the space is formed in the dielectric plate.

18. A plasma processing method of performing plasma processing on a substrate by using a plasma processing apparatus, the method comprising:
supplying a gas to a space in a processing container of the plasma processing apparatus; and
introducing radio frequency waves into the space in order to perform the plasma processing on the substrate placed on a stage in the processing container,
wherein the plasma processing apparatus includes:
the processing container;
the stage provided in the processing container;
a dielectric plate provided above the stage via the space in the processing container;
an upper electrode having flexibility and being provided above the dielectric plate, the upper electrode being configured to provide a gap between the dielectric plate and the upper electrode;
an introduction part of radio frequency waves that are VHF waves or UHF waves, the introduction part being provided at a horizontal end portion of the space;
a driving shaft that is a central axial line of the processing container extending in a vertical direction and is coupled to the upper electrode on the central axial line including a center of the stage; and
an actuator configured to move the driving shaft in the vertical direction.

* * * * *